United States Patent
Innocent

(10) Patent No.: US 9,040,893 B2
(45) Date of Patent: May 26, 2015

(54) IMAGE SENSOR PIXEL AND METHOD

(75) Inventor: Manuel Innocent, Wezemaal (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 228 days.

(21) Appl. No.: 13/642,455

(22) PCT Filed: Apr. 21, 2011

(86) PCT No.: PCT/US2011/033482
§ 371 (c)(1),
(2), (4) Date: Nov. 2, 2012

(87) PCT Pub. No.: WO2011/133806
PCT Pub. Date: Oct. 27, 2011

(65) Prior Publication Data
US 2013/0140441 A1    Jun. 6, 2013

Related U.S. Application Data

(60) Provisional application No. 61/326,250, filed on Apr. 21, 2010.

(51) Int. Cl.
*H03F 3/08* (2006.01)
*H04N 5/3745* (2011.01)

(52) U.S. Cl.
CPC ............... *H03F 3/08* (2013.01); *H04N 5/3745* (2013.01); *H04N 5/37452* (2013.01)

(58) Field of Classification Search
USPC ................. 250/208.1; 257/290, 292; 348/294
See application file for complete search history.

(56) References Cited

U.S. PATENT DOCUMENTS

| | | | |
|---|---|---|---|
| 5,625,210 A | 4/1997 | Lee et al. | |
| 6,566,697 B1 | 5/2003 | Fox et al. | |
| 6,952,004 B2 * | 10/2005 | Henderson | 250/214 A |
| 7,750,958 B1 | 7/2010 | Dierickx | |
| 7,990,446 B2 * | 8/2011 | Boemler | 348/294 |

* cited by examiner

*Primary Examiner* — Tony Ko

(57) ABSTRACT

In accordance with an embodiment, a 4T pixel includes a first switch having a control terminal and first and second current carrying terminals and an amplifier having an input terminal and an output terminal. A second switch is coupled between the first switch and the amplifier.

18 Claims, 13 Drawing Sheets

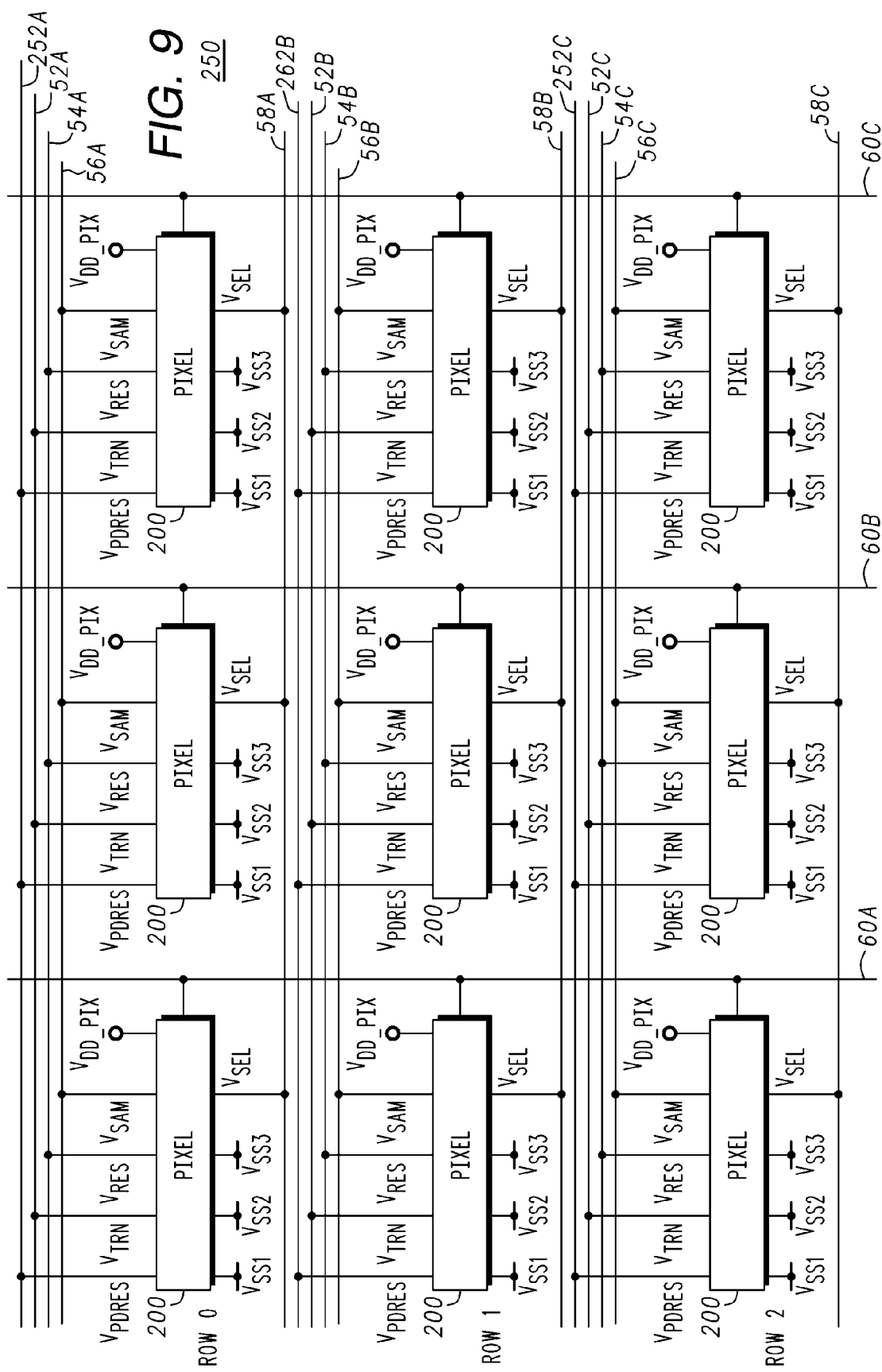

IMAGE SENSOR PIXEL AND METHOD

BACKGROUND

The present invention relates, in general, to electronics and, more particularly, to image sensors.

In the past, the electronics industry used solid-state image sensors to form pixels in camera systems. The pixels were configured into an array of rows and columns and contained photosensitive elements. Image sensors are disclosed in U.S. Pat. No. 5,625,210 issued to Paul P. Lee et al. on Apr. 29, 1997, U.S. Pat. No. 6,566,697 B1 issued to Eric C. Fox et al. on May 20, 2003, and U.S. Pat. No. 7,750,958 B1 issued to Bart Dierickx on Jul. 6, 2010. A drawback with these systems is their performance degradation caused by pixel storage node leakage (PSNL) and parasitic light sensitivity (PLS).

Accordingly, it would be advantageous to have an image sensor and method for operating the image sensor having improved performance parameters. In addition, it is desirable for the method and circuit to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 9 is a portion of an array of the pixels of FIG. 8 in accordance with another embodiment of the present invention;

Figure 1:
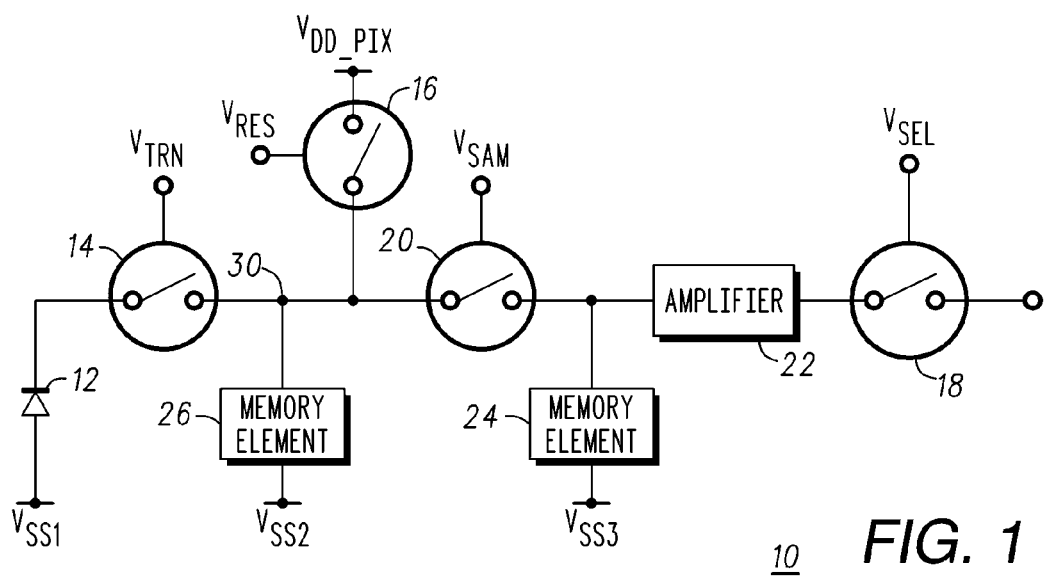
FIG. 1 is a circuit schematic of a pixel in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally the present invention provides an image sensor pixel and a method for operating the image sensor.

FIG. 1 is a circuit schematic of an image sensor pixel 10 in accordance with an embodiment of the present invention. Image sensor pixel 10 is comprised of a photodiode 12, a transfer switch 14, a reset switch 16, a select switch 18, a sampling switch 20, an amplifier 22, and memory elements 24 and 26. Optionally, memory element 26 is absent from image sensor pixel 10. Preferably, photodiode 12 is pinned photodiode capable of being fully depleted at a depletion voltage $V_{PIN}$. Each of switches 14-20 has a control terminal and a pair of current carrying terminals. Transfer switch 14 has a current carrying terminal connected to a cathode of photodiode 12 and a current carrying terminal commonly connected to a current carrying terminal of reset switch 16, a current carrying terminal of sampling switch 20, and a memory element 26 to form a node 30. The other current carrying terminal of reset switch 16 is coupled for receiving a source of operating potential such as, for example, $V_{DD\_PIX}$, and the other current carrying terminal of sampling switch 20 is connected to an input terminal of amplifier 22. The control terminal of transfer switch 14 is coupled for receiving a control signal $V_{TRN}$, the control terminal of reset switch 16 is coupled for receiving a control signal $V_{RES}$, the control terminal of sampling switch 20 is coupled for receiving a control signal $V_{SAM}$, and the control terminal of select switch 22 is coupled for receiving a control signal $V_{SEL}$. The anode of photodiode 12 is coupled for receiving a source of operating potential $V_{SS1}$, memory element 26 has a terminal coupled for receiving a source of operating potential $V_{SS2}$, and memory element 26 has a terminal coupled for receiving a source of operating potential $V_{SS3}$. By way of example, sources of operating potential $V_{SS1}$, $V_{SS2}$, and $V_{SS3}$ are at ground potential. It should be noted that the voltage levels of sources of operating potential $V_{SS1}$, $V_{SS2}$, and $V_{SS3}$ are not limitations of the present invention. For example, sources of operating potential $V_{SS1}$, $V_{SS2}$, and $V_{SS3}$ may be at the same level, each may be at different voltage levels, two of the three may be at the same level, etc. Switch 18 has a current carrying terminal connected to an output of amplifier 22 and a current carrying terminal for coupling to a column (not shown).

Figure 2:
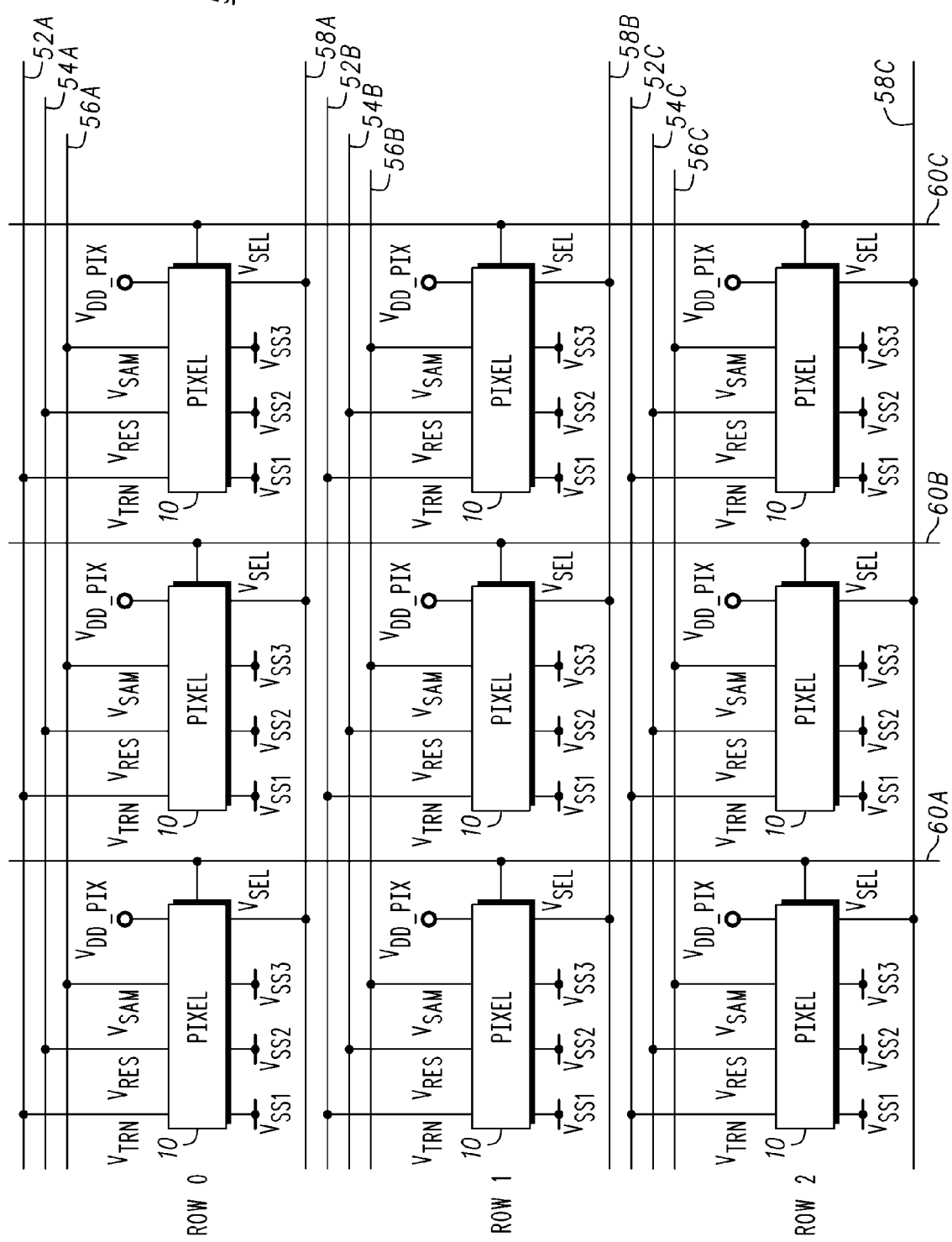
FIG. 2 is a portion of an array of the pixels of FIG. 1 in accordance with another embodiment of the present invention.

FIG. 2 is a circuit schematic of a portion of a pixel array in accordance with an embodiment of the present invention. What is shown in FIG. 2 is a 3×3 section 50 of an array of pixels 10. It should be noted that a typical pixel array may have more than a million pixels arranged in rows and columns. For the sake of clarity, pixels 10 have been illustrated in block form, where the circuit architecture of each pixel 10 is illustrated in FIG. 1. In accordance with an embodiment of the present invention, each pixel is connected to a reset bus, a transfer bus, a select bus, and a sample bus. The reset, transfer, select, and sample busses may be configured in a horizontal orientation. In addition, the pixels are connected to columns that are configured in a vertical orientation and serve as pixel outputs. It should be noted that the reset, transfer, select, and sample busses may be oriented in a vertical configuration and that the pixel outputs may be coupled to interconnects configured in rows. More particularly, each pixel 10 in a row 0 (shown in FIG. 2) has terminals coupled for receiving transfer control signal $V_{TRN}$, reset control signal $V_{RES}$, sampling control signal $V_{SAM}$, and select control signal $V_{SEL}$ from transfer bus 52A, reset bus 54A, sampling bus 56A, and select bus 58A, respectively. Each pixel 10 in a row 1 (shown in FIG. 2) has terminals coupled for receiving transfer control signal $V_{TRN}$, reset control signal $V_{RES}$, sampling control signal $V_{SAM}$, and select control signal $V_{SEL}$ from transfer bus 52B, reset bus 54B, sampling bus 56B, and select bus 58B, respectively. Each pixel 10 in a row 2 (shown in FIG. 2) has terminals coupled for receiving transfer control signal $V_{TRN}$, reset control signal $V_{RES}$, sampling control signal $V_{SAM}$, and select control signal $V_{SEL}$ from transfer bus 52C, reset bus 54C, sampling bus 56C, and select bus 58C, respectively. The outputs of pixels 10 are coupled to corresponding columns 60A, 60B, and 60C.

With reference to FIGS. 1 and 2, an array of pixels comprising a plurality of image sensors 10 can operate in a rolling shutter operating mode or in a snapshot operating mode. In both the rolling shutter and the snapshot operating modes, the voltages across photodiodes 12 are reset or discharged before the start of the integration time. Optionally, memory element 26 may be reset to a predetermined voltage level before the start of the integration time. In the snapshot shutter mode of operation, all the pixels in the array of pixels are reset by applying control voltages $V_{TRN}$ and $V_{RES}$ to the control terminals of switches 14 and 16, respectively. These control voltages close switches 14 and 16 allowing photodiode diodes 12 and memory elements 26 to discharge through source of operating potential $V_{DD\_PIX}$. In response to sampling switch 20 being open, memory element 24 remains undisturbed and in response to sampling switch 20 being closed, memory element 24 is reset to a predefined voltage such as, $V_{DD\_PIX}$.

Figure 3:
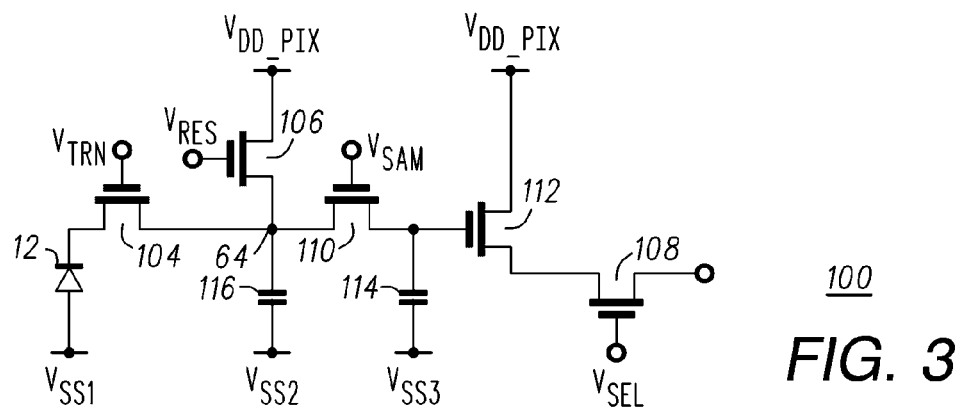
FIG. 3 is a circuit schematic of a pixel in accordance with another embodiment of the present invention.

FIG. 3 is a circuit schematic of an image sensor pixel 100 in accordance with another embodiment of the present invention. Image sensor pixel 100 is comprised of a photodiode 12, a transfer transistor 104, a reset transistor 106, a select transistor 108, a sampling transistor 110, a source follower transistor 112, and floating diffusion capacitors 114 and 116. By way of example, transistors 104-112 are field effect transistors, where each transistor has a gate, a drain, and a source. Suitable transistor types for transistors 104-112 include Metal Oxide Field Effect Transistors (MOSFETs), Junction Field Effect Transistors (JFETs), Bipolar Junction Transistors (BJTs), or the like. More particularly, the source of transistor 104 is connected to a cathode of a photodiode 12 and the drain of transistor 104 is commonly connected to the source of reset transistor 106, the drain of sampling transistor 110, and a terminal of parasitic floating diffusion capacitor 116 to form a node 64. The source of sampling transistor 110 is commonly connected to the gate of source follower transistor 112 and a terminal of floating diffusion capacitor 114. The drains of reset transistor 106 and source follower transistor 112 are coupled for receiving a source of operating potential $V_{DD\_PIX}$. Although transistors 106 and 112 are shown as being coupled for receiving the same potential, i.e., $V_{DD\_PIX}$, it should be understood that this is not a limitation of the present invention. Thus, the potentials coupled to the drains of transistors 106 and 112 may be different.

The source of source follower transistor 112 is connected to a current carrying electrode of select transistor 108 and the gate of select transistor 108 is coupled for receiving a select signal $V_{SEL}$. The gates of transistors 104, 106, and 110 are coupled for receiving control signals $V_{TRN}$, $V_{RES}$, and $V_{SAM}$, respectively. The anode of photodiode 12 is coupled for receiving source of operating potential $V_{SS1}$, a terminal of parasitic floating diffusion capacitor 116 is coupled for receiving source of operating potential $V_{SS2}$, and a terminal of floating diffusion capacitor 114 is coupled for receiving source of operating potential $V_{SS3}$. By way of example, sources of operating potential $V_{SS1}$, $V_{SS2}$, and $V_{SS3}$ are at ground potential. It should be noted that the voltage levels of sources of operating potential $V_{SS1}$, $V_{SS2}$, and $V_{SS3}$ are not limitations of the present invention. Sources of operating potential $V_{SS1}$, $V_{SS2}$, and $V_{SS3}$ may be at the same voltage level, each may be at different voltage levels, two of the three may be at the same voltage level, etc.

Figure 4:
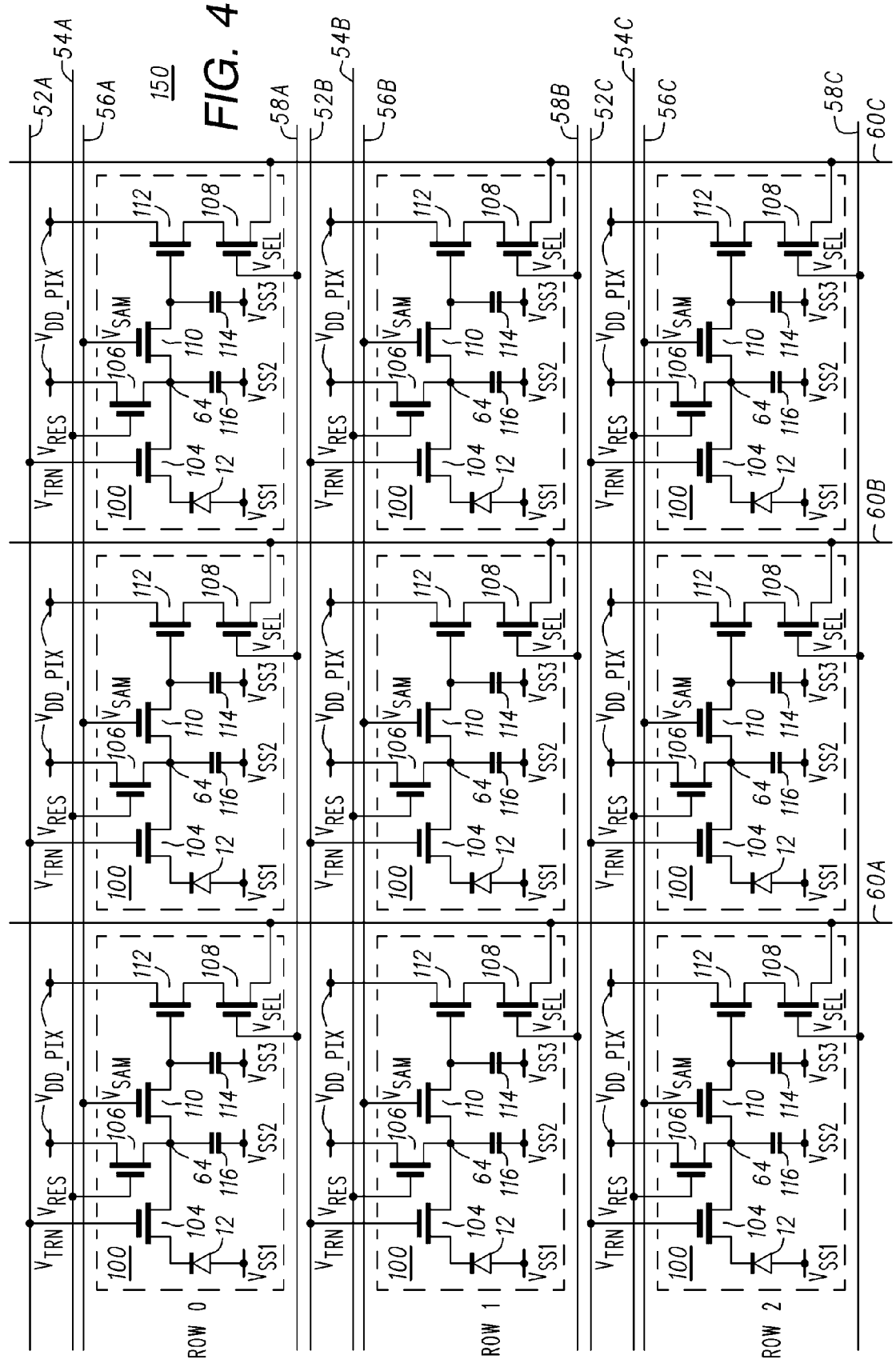
FIG. 4 is a portion of an array of the pixels of FIG. 3 in accordance with another embodiment of the present invention.

FIG. 4 is a circuit schematic of an active pixel array in accordance with another embodiment of the present invention. What is shown in FIG. 4 is a 3×3 section 150 of a sensor array of active pixels 100. Like 3×3 section 50 shown in FIG. 2, each pixel is connected to a reset bus, a transfer bus, a select bus, and a sample bus. The reset, transfer, select, and sample busses may be configured in a horizontal orientation. In addition, the pixels are connected to columns that are configured in a vertical orientation and that may serve as pixel outputs. It should be noted that the reset, transfer, select, and sample busses may be oriented in a vertical configuration and that the pixel outputs may be coupled to interconnects configured in rows. Each pixel 100 in a row 0 (shown in FIG. 4) has terminals coupled for receiving transfer control signal $V_{TRN}$, reset control signal $V_{RES}$, sampling control signal $V_{SAM}$, and select control signal $V_{SEL}$ from transfer bus 52A, reset bus 54A, sampling bus 56A, and select bus 58A, respectively. More particularly, the gates of transfer transistors 104 associated with row 0 are connected to transfer bus 52A, the gates of reset transistors 106 associated with row 0 are connected to reset bus 54A, the gates of sampling transistors 110 associated with row 0 are connected to bus 56A, and the gates of select transistors 108 associated with row 0 are connected to select bus 58A. Each pixel 100 in a row 1 (shown in FIG. 4) has terminals coupled for receiving transfer control signal $V_{TRN}$, reset control signal $V_{RES}$, sampling control signal $V_{SAM}$, and select control signal $V_{SEL}$ from transfer bus 52B, reset bus 54B, sampling bus 56B, and select bus 58B, respectively. More particularly, the gates of transfer transistors 104 associated with row 1 are connected to transfer bus 52B, the gates of reset transistors 106 associated with row 1 are connected to reset bus 54B, the gates of sampling transistors 110 associated with row 1 are connected to bus 56B, and the gates of select transistors 108 associated with row 1 are connected to select bus 58B. Each pixel 100 in a row 2 (shown in FIG. 4) has terminals coupled for receiving transfer control signal $V_{TRN}$, reset control signal $V_{RES}$, sampling control signal $V_{SAM}$, and select control signal $V_{SEL}$ from transfer bus 52C, reset bus 54C, sampling bus 56C, and select bus 58C, respectively. More particularly, the gates of transfer transistors 104 associated with row 2 are connected to transfer bus 52C, the gates of reset transistors 106 associated with row 2 are connected to reset bus 54C, the gates of sampling transistors 110 associated with row 2 are connected to bus 56C, and the gates of select transistors 108 associated with row 2 are connected to select bus 58C. The outputs of pixels 100 are coupled to corresponding columns 60A, 60B, and 60C.

Figure 8:
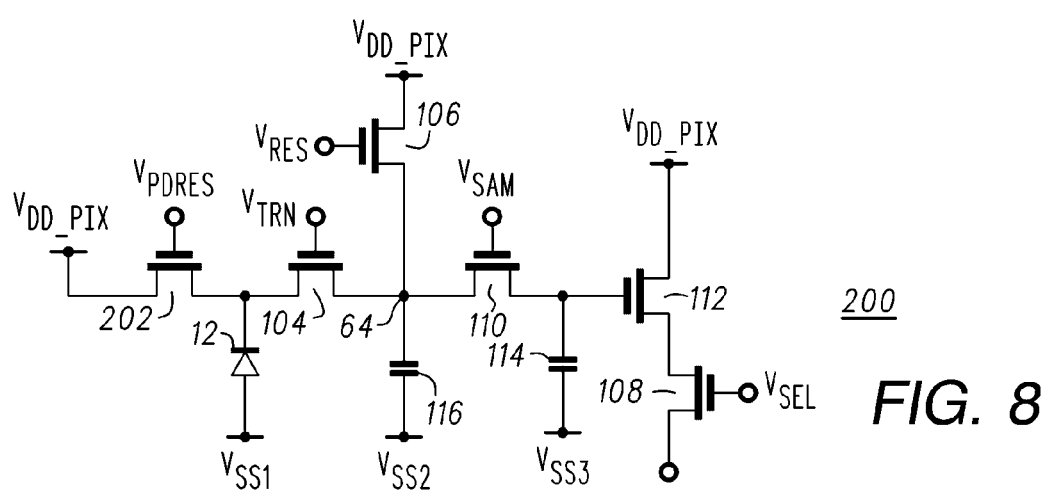
FIG. 8 is a circuit schematic of a pixel in accordance with another embodiment of the present invention.
Figure 5:
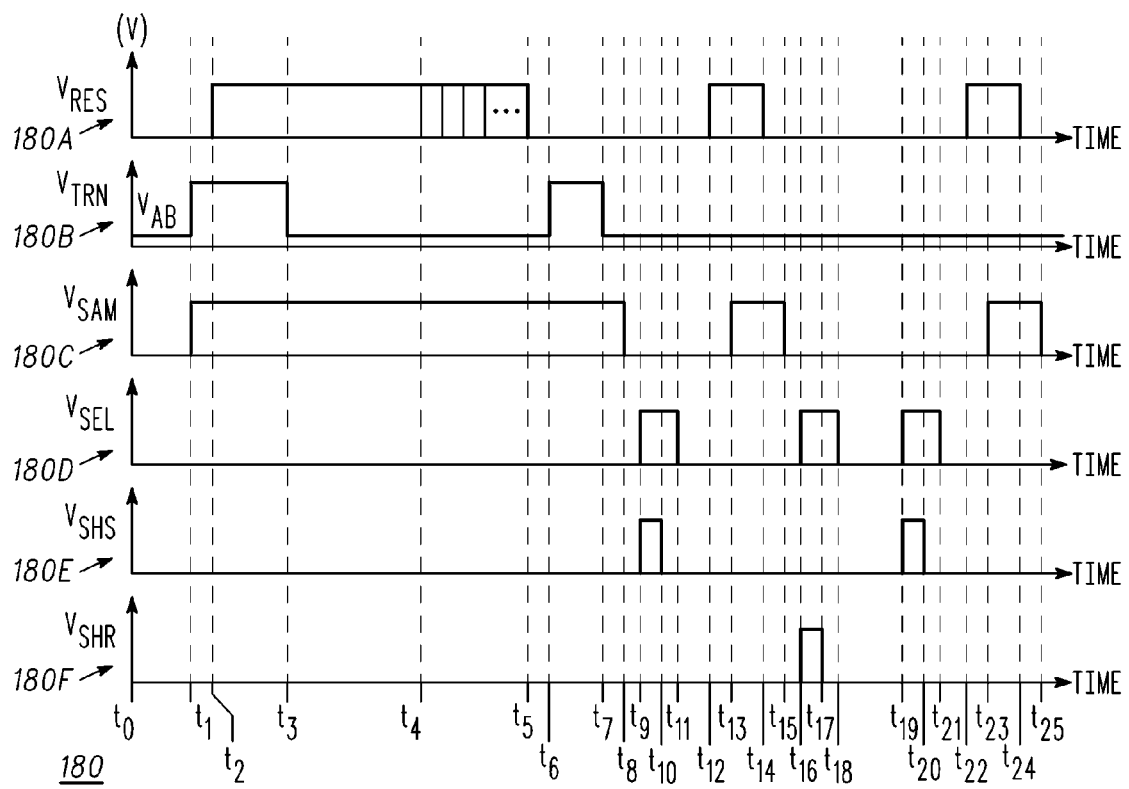
FIG. 5 is a timing diagram of a snapshot operating mode in accordance with another embodiment of the present invention.

FIG. 5 is a timing diagram 180 that includes plots 180A, 180B, 180C, 180D, 180E, and 180F illustrating the operation of, for example, pixel 200 in a snapshot operating mode in accordance with embodiments of the present invention where a transistor like transistor 202 shown in FIG. 8 is absent. Plots 180A, 180B, 180C, 180D, 180E, and 180F illustrate reset voltage $V_{RES}$, transfer voltage $V_{TRN}$, sampling voltage $V_{SAM}$, select voltage $V_{SEL}$, sample/hold signal $V_{SHS}$, and sample/hold reset signal $V_{SHR}$ over time (t). It should be noted that the description of FIG. 5 applies to reading out rows of a pixel such as, for example, rows 0 and 1 of a pixel array. The time period from time $t_0$ to about time $t_8$ may be referred to as the frame overhead time, the time period from about time $t_5$ to about time $t_{12}$, i.e., the times reset voltage $V_{RES}$ of the last row transitions to a logic low voltage level is referred to as a line overhead time, readout of a row 0 begins at about time $t_8$. At time $t_0$, transfer voltage $V_{TRN}$ is at a constant value $V_{AB}$ to inhibit blooming, i.e., to promote anti blooming, reset signal $V_{RES}$, sampling signal $V_{SAM}$, select voltage $V_{SEL}$ sample/hold signal $V_{SHS}$, and sample/hold reset signal $V_{SHR}$ are at a logic low voltage level. At time $t_1$, transfer voltage $V_{TRN}$ and sampling signal $V_{SAM}$ transition from a logic low voltage level to a logic high voltage level and at time $t_2$, reset voltage $V_{RES}$ transitions from a logic low voltage level to a logic high voltage level. In response to voltages $V_{TRN}$, $V_{RES}$, and $V_{SAM}$ being at a logic high voltage level, photodiode 12 is reset, and floating diffusion capacitor 24 and parasitic floating diffusion capacitor 26 are charged to a voltage level approximately equal to operating potential $V_{DD\_PIX}$.

At time $t_3$, transfer voltage $V_{TRN}$ transitions to a logic low voltage level, which starts the integration time, i.e., the collection of electrons by photodiode 12.

At time $t_4$, voltage $V_{RES}$ transitions to a logic low voltage level, which starts the line overhead time. It should be noted that from time $t_4$ to time $t_5$ the reset voltage $V_{RES}$ of each row non-simultaneously transitions to a logic low voltage level. At time $t_6$, transfer voltage $V_{TRN}$ transitions to a logic high voltage level, which turns on transfer transistor 104. At time $t_7$, transfer voltage $V_{TRN}$ transitions to a logic low voltage level. At time $t_8$, sampling voltage $V_{SAM}$ transitions to a logic low voltage level.

At time $t_9$, select voltage $V_{SEL}$, and sample/hold signal $V_{SHS}$ transition to a logic high voltage level. At time $t_{10}$, sample/hold signal $V_{SHS}$ transitions to a logic low voltage level and at time $t_{11}$ select voltage $V_{SEL}$ transitions to a logic low voltage level.

At time $t_{12}$, reset voltage $V_{RES}$ transitions to a logic high voltage level and at time $t_{13}$ sampling voltage $V_{SAM}$ transitions to a logic high voltage level.

At time $t_{14}$, reset voltage $V_{RES}$ transitions to a logic low voltage level and at time $t_{15}$ sampling voltage $V_{SAM}$ transitions to a logic low voltage level. A global reset occurs between times $t_{12}$ and $t_{14}$, after which the data for the next row is read out.

At time $t_{16}$, select voltage $V_{SEL}$ and sample/hold reset signal $V_{SHR}$ transition to a logic high voltage level. At time $t_{17}$, sample/hold reset signal $V_{SHR}$ transitions to a logic low voltage level and at time $t_{18}$ select voltage $V_{SEL}$ transitions to a logic low voltage level.

At time $t_{19}$, select voltage $V_{SEL}$ and sample/hold signal $V_{SHS}$ transition to a logic high voltage level. At time $t_{20}$, sample/hold signal $V_{SHS}$ transitions to a logic low voltage level and at time $t_{21}$ select voltage $V_{SEL}$ transitions to a logic low voltage level.

At time $t_{22}$, reset voltage $V_{RES}$ transitions to a logic high voltage level and at time $t_{23}$ sampling voltage $V_{SAM}$ transitions to a logic high voltage level.

At time $t_{24}$, reset voltage $V_{RES}$ transitions to a logic low voltage level and at time $t_{25}$ sampling voltage $V_{SAM}$ transitions to a logic low voltage level.

It should be further noted that reset signal $V_{RES}$ is applied at the same time for all the rows and transitions to a logic low voltage level for a particular row during readout of the dark (reset) level of that particular row. In addition, typically the reset signal $V_{RES}$ sequentially turns off on a row by row basis during the frame overhead time.

Figure 6:
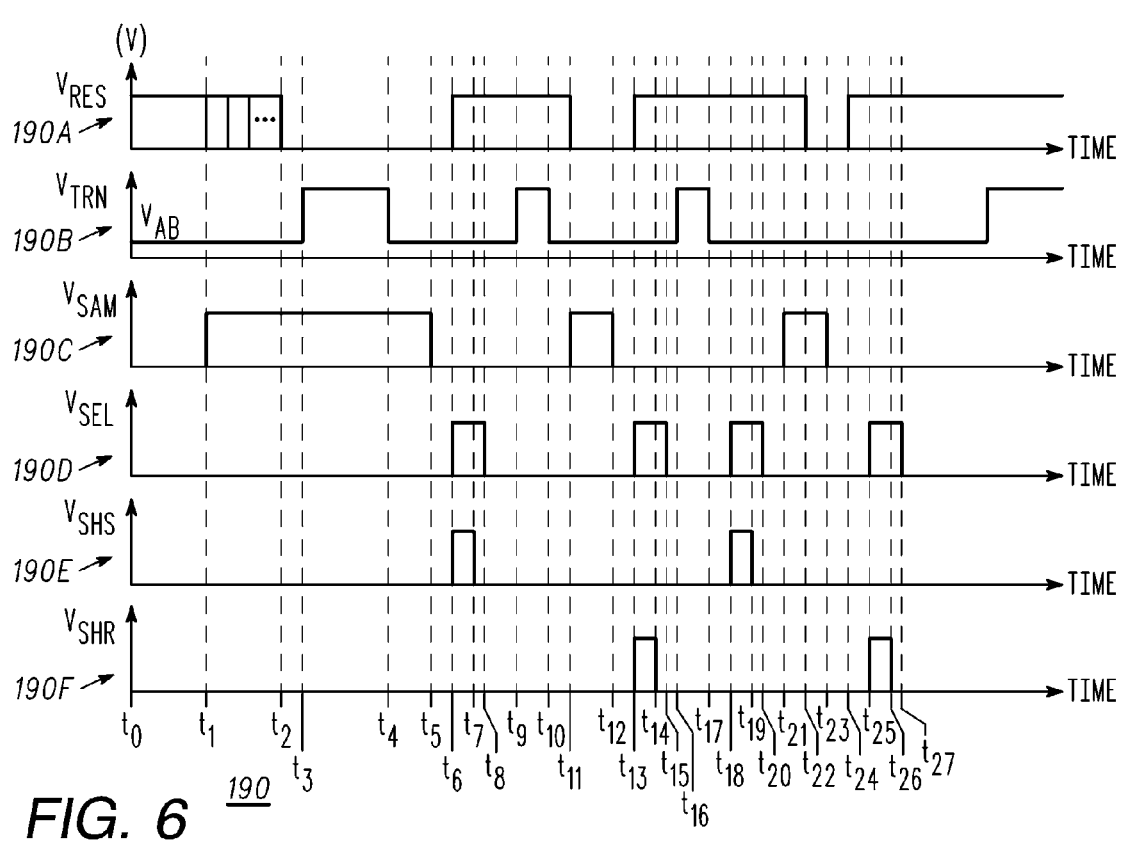
FIG. 6 is a timing diagram of a snapshot operating mode in accordance with another embodiment of the present invention.

FIG. 6 is a timing diagram 190 that includes plots 190A, 190B, 190C, 190D, 190E, and 190F illustrating the operation of, for example, pixel 200 in a pipelined snapshot operating mode in accordance with embodiments of the present invention where a transistor such as transistor 202 shown in FIG. 8 is absent. The frame operating time occurs during the period from time about $t_1$ to about time $t_4$, where sampling voltage $V_{SAM}$ is at a logic high voltage level. Frame capturing and readout occurs after about time $t_4$. Plots 190A, 190B, 190C, 190D, 190E, and 190F illustrate reset voltage $V_{RES}$, transfer voltage $V_{TRN}$, sampling voltage $V_{SAM}$, select voltage $V_{SEL}$, sample/hold signal $V_{SHS}$, and sample/hold reset signal $V_{SHR}$ over time (t). It should be noted that reset signal $V_{RES}$ is off or at a logic low voltage level in sequential mode row per row transfer during the frame overhead time. It should be noted that the description of FIG. 6 applies to reading out rows of a pixel such as, for example, rows 0 and 1 of a pixel array.

Figure 7:
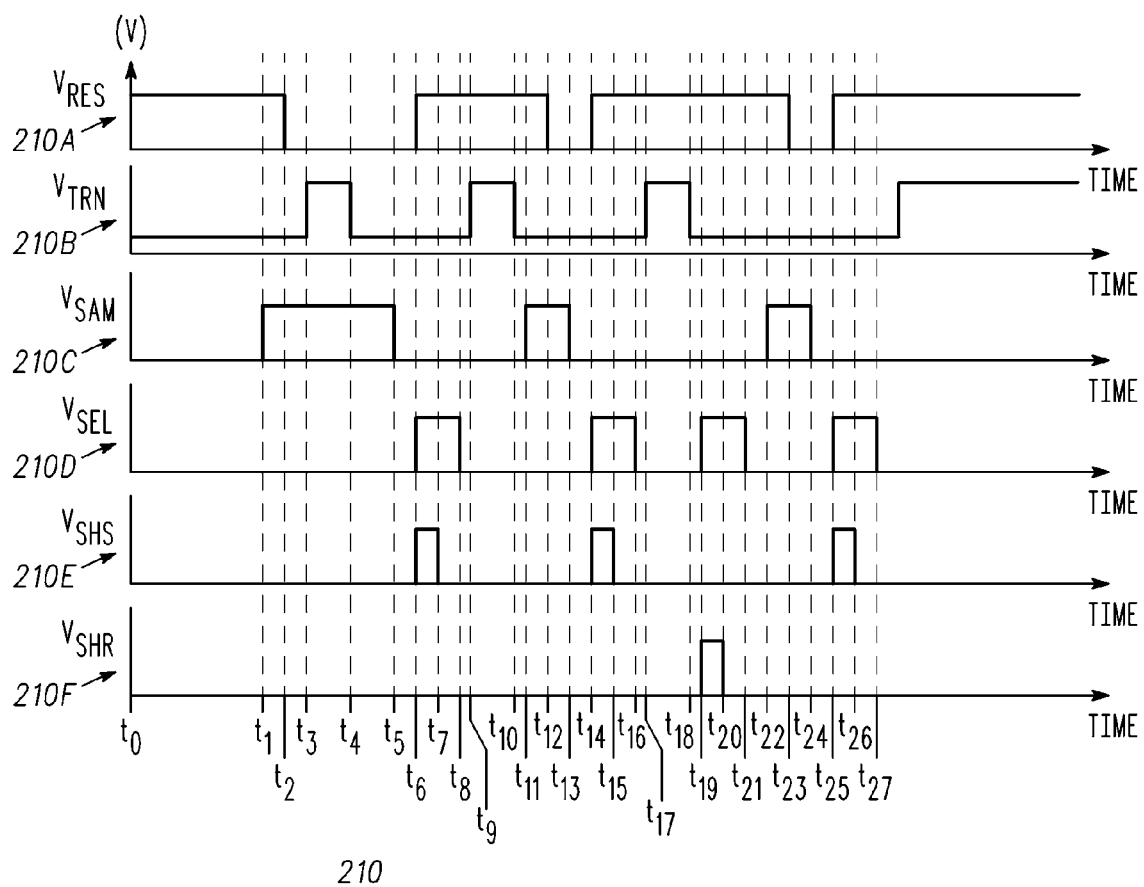
FIG. 7 is a timing diagram of a snapshot operating mode in accordance with another embodiment of the present invention.

FIG. 7 is a timing diagram 210 that includes plots 210A, 210B, 210C, 210D, 210E, and 210F illustrating the operation of, for example, pixel 200 in a snapshot operating mode in accordance with embodiments of the present invention. Plots 210A, 210B, 210C, 210D, 210E, and 210F illustrate reset voltage $V_{RES}$, transfer voltage $V_{TRN}$, sampling voltage $V_{SAM}$, select voltage $V_{SEL}$, sample/hold signal $V_{SHS}$, and sample/hold reset signal $V_{SHR}$ over time (t). The frame overhead time occurs from about time $t_1$ to about time $t_4$, and frame capturing and readout occurs after about time $t_4$. In accordance with this embodiment a row is sampled and the other rows are not sampled.

FIG. 8 is a circuit schematic of a pixel 200 in accordance with another embodiment of the present invention. Pixel 200 is similar to pixel 100, with the addition of a photodiode reset transistor 202, which has a gate terminal, a drain terminal, and a source terminal. The source terminal of photodiode reset transistor 202 is connected to node 64 and the drain terminal is coupled for receiving pixel voltage $V_{DD\_PIX}$. It should be noted that the drain terminal is not limited to being coupled for receiving pixel voltage $V_{DD\_PIX}$ and that it can be coupled for receiving a different voltage. The gate terminal of photodiode reset transistor 202 is coupled for receiving a photodiode reset voltage $V_{PDRES}$.

FIG. 9 is a circuit schematic of an active pixel array in accordance with another embodiment of the present invention. What is shown in FIG. 9 is a 3×3 section 250 of an array of pixels 200. Like 3×3 section 50 shown in FIG. 2, each pixel 200 is connected to a reset bus, a transfer bus, a select bus, and a sample bus. In addition, each pixel 200 is connected to a photodiode reset bus. The reset, transfer, select, sample, and photodiode reset busses may be configured in a horizontal orientation. In addition, the pixels are connected to columns that are configured in a vertical orientation and may serve as pixel outputs. It should be noted that the reset, transfer, select, and sample busses may be oriented in a vertical configuration and that the pixel outputs may be coupled to interconnects configured in rows. Each pixel 200 in a row 0 (shown in FIG. 8) has terminals coupled for receiving transfer control signal $V_{TRN}$, reset control signal $V_{RES}$, sampling control signal $V_{SAM}$, select control signal $V_{SEL}$, and a photodiode reset control signal $V_{PDRES}$ from transfer bus 52A, reset bus 54A, sampling bus 56A, and select bus 58A, and photodiode reset bus 252A, respectively. More particularly and with reference to FIGS. 8 and 9, the gates of transfer transistors 104 associated with row 0 are connected to transfer bus 52A, the gates of reset transistors 106 associated with row 0 are connected to reset bus 54A, the gates of sampling transistors 110 associated with row 0 are connected to bus 56A, the gates of select transistors 108 associated with row 0 are connected to select bus 58A, and the gates of photodiode reset transistors 202 associated with row 0 are connected to bus 252A. Each pixel 200 in a row 1 (shown in FIG. 8) has terminals coupled for receiving transfer control signal $V_{TRN}$, reset control signal $V_{RES}$, sampling control signal $V_{SAM}$, select control signal $V_{SEL}$, and photodiode reset control signal $V_{PDRES}$ from transfer bus 52B, reset bus 54B, sampling bus 56B, select bus 58B, and photodiode reset control bus 252B, respectively. More particularly, the gates of transfer transistors 104 associated with row 1 are connected to transfer bus 52B, the gates of reset transistors 106 associated with row 1 are connected to reset bus 54B, the gates of sampling transistors 110 associated with row 1 are connected to bus 56B, the gates of select transistors 108 associated with row 1 are connected to select bus 58B, and the gates of photodiode reset transistors 202 are connected to photodiode reset bus 252B. Each pixel 200 in a row 2 (shown in FIG. 8) has terminals coupled for receiving transfer control signal $V_{TRN}$, reset control signal $V_{RES}$, sampling control signal $V_{SAM}$, select control signal $V_{SEL}$, and photodiode reset control signal $V_{PDRES}$ from transfer bus 52C, reset bus 54C, sampling bus 56C, select bus 58C, and photodiode reset control bus 252C, respectively. More particularly, the gates of transfer transistors 104 associated with row 2 are connected to transfer bus 52C, the gates of reset transistors 106 associated with row 2 are connected to reset bus 54C, the gates of sampling transistors 110 associated with row 2 are connected to bus 56C, the gates of select transistors 108 associated with row 2 are connected to select bus 58C, and the gates of photodiode reset transistors 200 are connected to photodiode reset bus 252C. The outputs of pixels 200 are coupled to corresponding columns 60A, 60B, and 60C.

Figure 10:
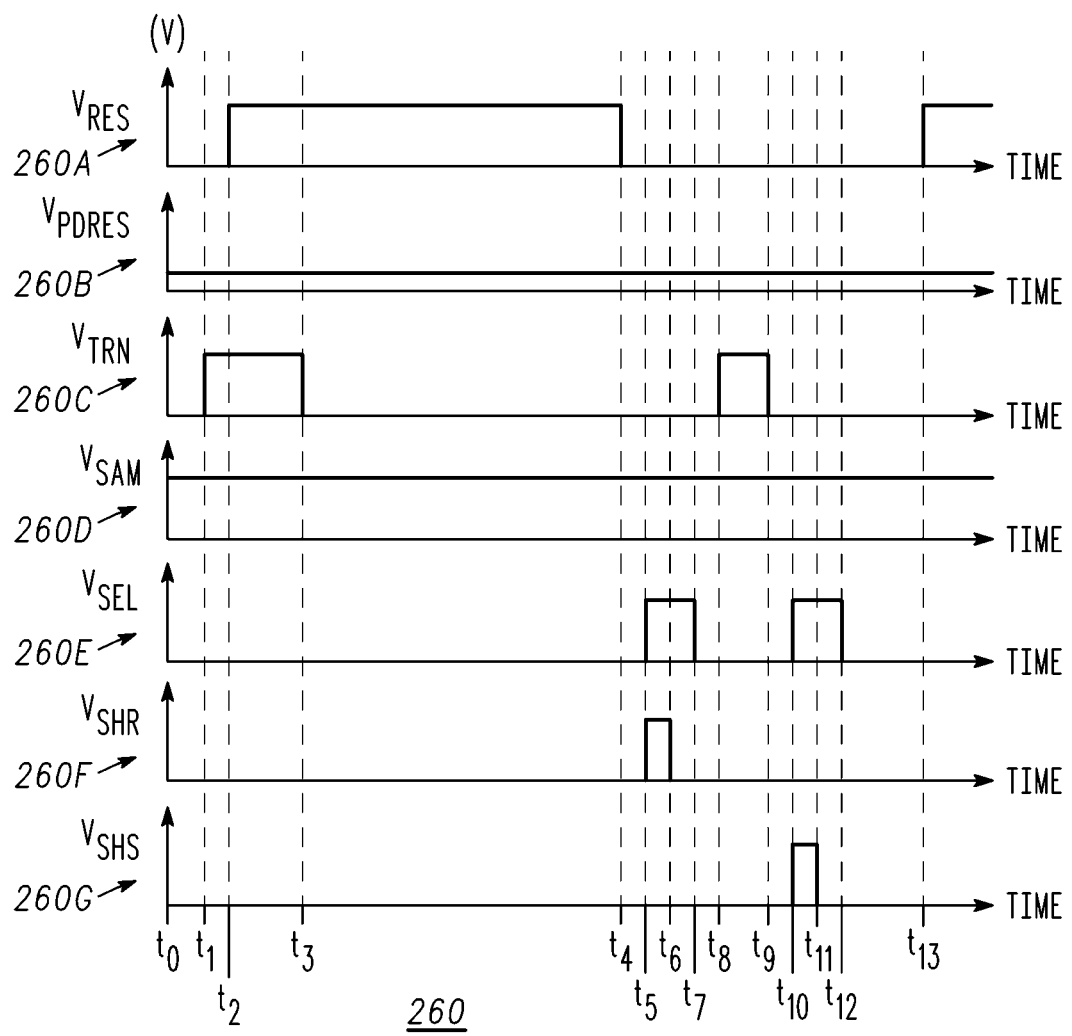
FIG. 10 is a timing diagram of a rolling shutter operating mode in accordance with another embodiment of the present invention.

FIG. 10 is a timing diagram 260 that includes plots 260A, 260B, 260C, 260D, 260E, and 260F illustrating the operation of, for example, pixel 200 in a rolling shutter operating mode in accordance with embodiments of the present invention. Plots 260A, 260B, 260C, 260D, 260E, and 260F illustrate reset voltage $V_{RES}$, photodiode reset voltage $V_{PDRES}$, transfer voltage $V_{TRN}$, sampling voltage $V_{SAM}$, select voltage $V_{SEL}$, sample/hold signal $V_{SHS}$, and sample/hold reset signal $V_{SHR}$ over time (t). It should be noted that the description of FIG. 10 applies to reading out a row such as, for example, row 0 of a pixel array. At time $t_0$, photodiode reset voltage $V_{PDRES}$ is at a constant value $V_{AB}$ to inhibit blooming, i.e., to promote anti blooming, select voltage $V_{SEL}$ is at a logic low voltage level, and sampling voltage $V_{SAM}$ is at a logic high voltage level. At time $t_1$, transfer voltage $V_{TRN}$ transitions from a logic low voltage level to a logic high voltage level and at time $t_2$, reset voltage $V_{RES}$ transitions from a logic low voltage level to a logic high voltage level. In response to voltages $V_{TRN}$ and $V_{RES}$ being at a logic high voltage level, photodiode 12 is reset and parasitic floating diffusion capacitor 26 is charged to a voltage level approximately equal to operating potential $V_{DD\_PIX}$. Because, sampling voltage $V_{SAM}$ is at a logic high voltage level, floating diffusion capacitor 24 is charged to a voltage level approximately equal to operating potential $V_{DD\_PIX}$.

At time $t_3$, transfer voltage $V_{TRN}$ transitions to a logic low voltage level, which starts the integration time, i.e., the collection of electrons by photodiode 12.

At time $t_4$, voltage $V_{RES}$ transitions to a logic low voltage level, which starts the line overhead time. At time $t_5$, select voltage $V_{SEL}$ transitions to a logic high voltage level, which turns on select transistor 20. In addition, sample/hold reset voltage $V_{SHR}$ transitions to a logic high voltage level so that the reset voltage stored across floating diffusion capacitor 24 can be sampled. At time $t_6$, the sample/hold signal $V_{SHS}$ transitions to a logic low voltage level and at time $t_7$ select voltage $V_{SEL}$ transitions to a logic low voltage level. At time $t_8$, transfer voltage $V_{TRN}$ transitions to a logic high voltage level. In response to transfer voltage $V_{TRN}$ being at a logic high voltage level, charge present on photodiode 12 is transferred to floating diffusion capacitor 24.

At time $t_9$, transfer voltage $V_{TRN}$ transitions to a logic low voltage level. At time $t_{10}$, select voltage $V_{SEL}$ transitions to a logic high voltage level, which turns on select transistor 20. In addition, sample/hold signal $V_{SHS}$ transitions to a logic high voltage level so that the voltage stored across floating diffusion capacitor 24 can be sampled. At time $t_{11}$, sample/hold signal $V_{SHS}$ transitions to a logic low voltage level and at time $t_{12}$, select voltage $V_{SEL}$ transitions to a logic low voltage level. At time $t_{13}$, reset voltage $V_{RES}$ transitions to a logic high voltage level.

The line overhead time occurs between about time $t_4$ and about time $t_{13}$. With the timing pattern of timing diagram 260, correlated double sampling can be performed because reset voltage level $V_{RES}$ and the signal level of the same integration period are sampled. Preferably, reset voltage $V_{RES}$ of a row is pulsed low during the line overhead time.

Figure 11:
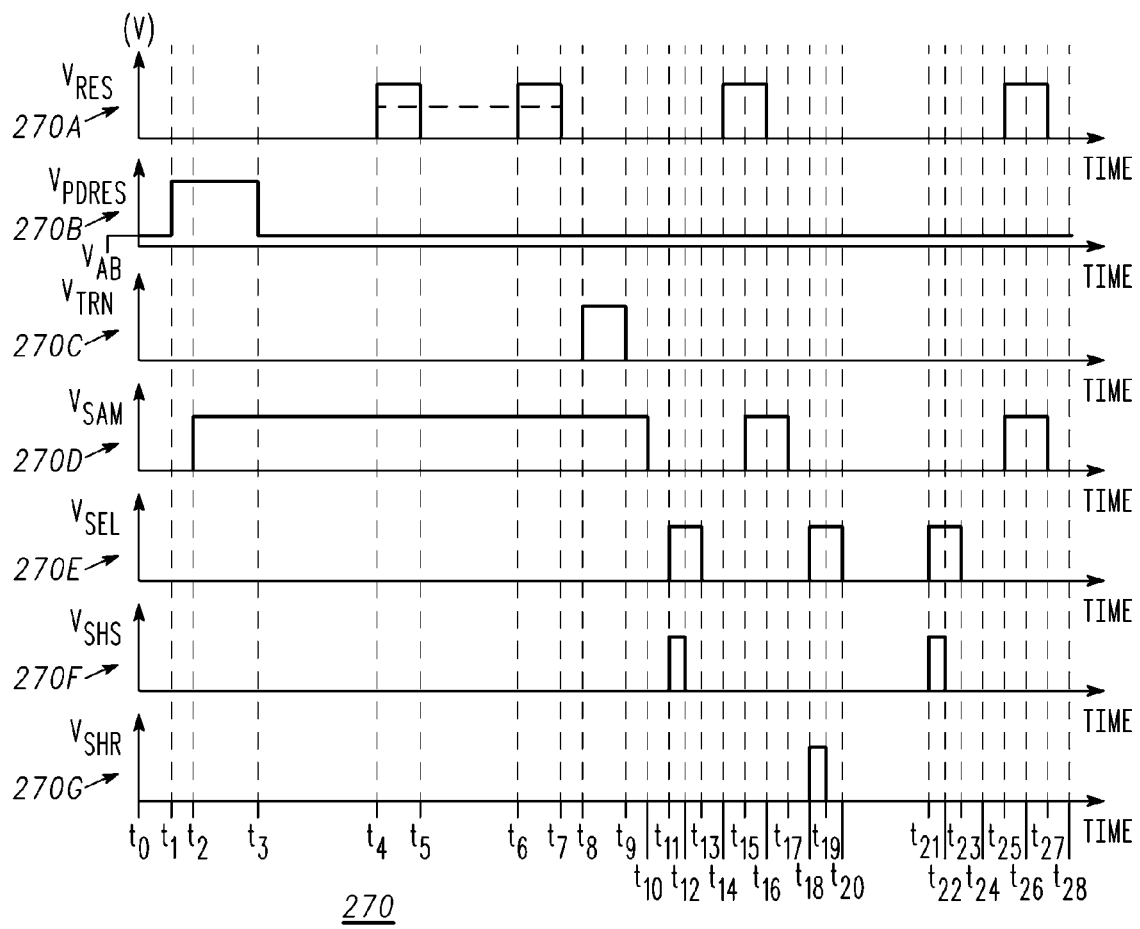
FIG. 11 is a timing diagram of a snapshot operating mode in accordance with another embodiment of the present invention.

FIG. 11 is a timing diagram 270 that includes plots 270A, 270B, 270C, 270D, 270E, and 270F illustrating the operation of, for example, pixel 200 in a snapshot operating mode in accordance with embodiments of the present invention where a transistor such as, for example, transistor 202 of FIG. 8 is available. Plots 270A, 270B, 270C, 270D, 270E, and 270F illustrate reset voltage $V_{RES}$, photodiode reset voltage $V_{PDRES}$, transfer voltage $V_{TRN}$, sampling voltage $V_{SAM}$, select voltage $V_{SEL}$, and column voltage $V_{SCOL}$ over time (t). It should be noted that the description of FIG. 11 applies to reading out a row such as, for example, row 0 of a pixel array. At time $t_0$, photodiode reset voltage $V_{PDRES}$ is at a constant value $V_{AB}$, reset signal $V_{RES}$ is at a logic low voltage level, select voltage $V_{SEL}$ is at a logic low voltage level, and sampling voltage $V_{SAM}$ is at a logic low voltage level.

At time $t_1$, photodiode reset voltage $V_{PDRES}$ transitions to a logic high voltage level to reset photodiode 12 and at time $t_2$ sample voltage $V_{SAM}$ transitions from a logic low voltage level to a logic high voltage level. In response to voltages $V_{PDRES}$ and $V_{SAM}$ being at a logic high voltage level, photodiode 12 is reset and floating diffusion capacitor 24 is charged to a voltage level approximately equal to the voltage across parasitic diffusion capacitor 26.

At time $t_3$, photodiode reset voltage $V_{PDRES}$ transitions to a voltage level substantially equal to voltage level $V_{AB}$.

From times $t_4$-$t_7$, voltage $V_{RES}$ of every row of pixels sequentially transitions to a logic high voltage level, which resets all the rows in an array of pixels. Then the rows of pixels sequentially transition to a logic low voltage level.

At time $t_8$, transfer voltage $V_{TRN}$ transitions to a logic high voltage level, which turns on transfer transistor 104 and transfers the electrons stored in photodiode 12 to floating diffusion capacitor 24. At time $t_9$, transfer voltage $V_{TRN}$ transitions to a logic low voltage level and at time $t_{10}$ sampling voltage $V_{SAM}$ transitions to a logic low voltage level. It should be noted that the field overhead time ranges from approximately time $t_1$ and ends at approximately time $t_{10}$.

At time $t_{11}$, select voltage $V_{SEL}$ and sample/hold signal $V_{SHS}$ transition to a logic high voltage level so that the reset voltage stored across floating diffusion capacitor 24 can be sampled. At time $t_{12}$, sample/hold signal $V_{SHS}$ transitions to a logic low voltage level and at time $t_{13}$ select voltage $V_{SEL}$ transitions to a logic low voltage level.

At time $t_{14}$, reset voltage $V_{RES}$ transitions to a logic high voltage level. At time $t_{15}$, sampling voltage $V_{SAM}$ transitions to a logic high voltage level.

At time $t_{16}$, reset voltage $V_{RES}$ transitions to a logic low voltage level and at time $t_{17}$ sampling voltage $V_{SAM}$ transitions to a logic low voltage level.

At time $t_{18}$, select voltage $V_{SEL}$ and sample/hold reset signal $V_{SHR}$ transition to a logic high voltage level so that the reset voltage stored across floating diffusion capacitor 24 can be sampled. At time $t_{19}$, sample/hold reset signal $V_{SHR}$ transitions to a logic low voltage level and at time $t_{20}$ select voltage $V_{SEL}$ transitions to a logic low voltage.

At time $t_{21}$, select voltage $V_{SEL}$ and sample/hold reset signal $V_{SHR}$ transition to a logic high voltage level so that the reset voltage stored across floating diffusion capacitor 24 of the next row can be sampled. At time $t_{22}$, sample/hold reset signal $V_{SHR}$ transitions to a logic low voltage level and at time $t_{23}$ select voltage $V_{SEL}$ transitions to a logic low voltage.

At time $t_{25}$, sampling voltage $V_{SAM}$ transitions to a logic high voltage level and at time $t_{26}$, reset voltage $V_{RES}$ transitions to a logic high voltage level.

At time $t_{27}$ sampling voltage $V_{SAM}$ transitions to a logic low voltage level and at time $t_{28}$, reset voltage $V_{RES}$ transitions to a logic low voltage level.

Figure 12:
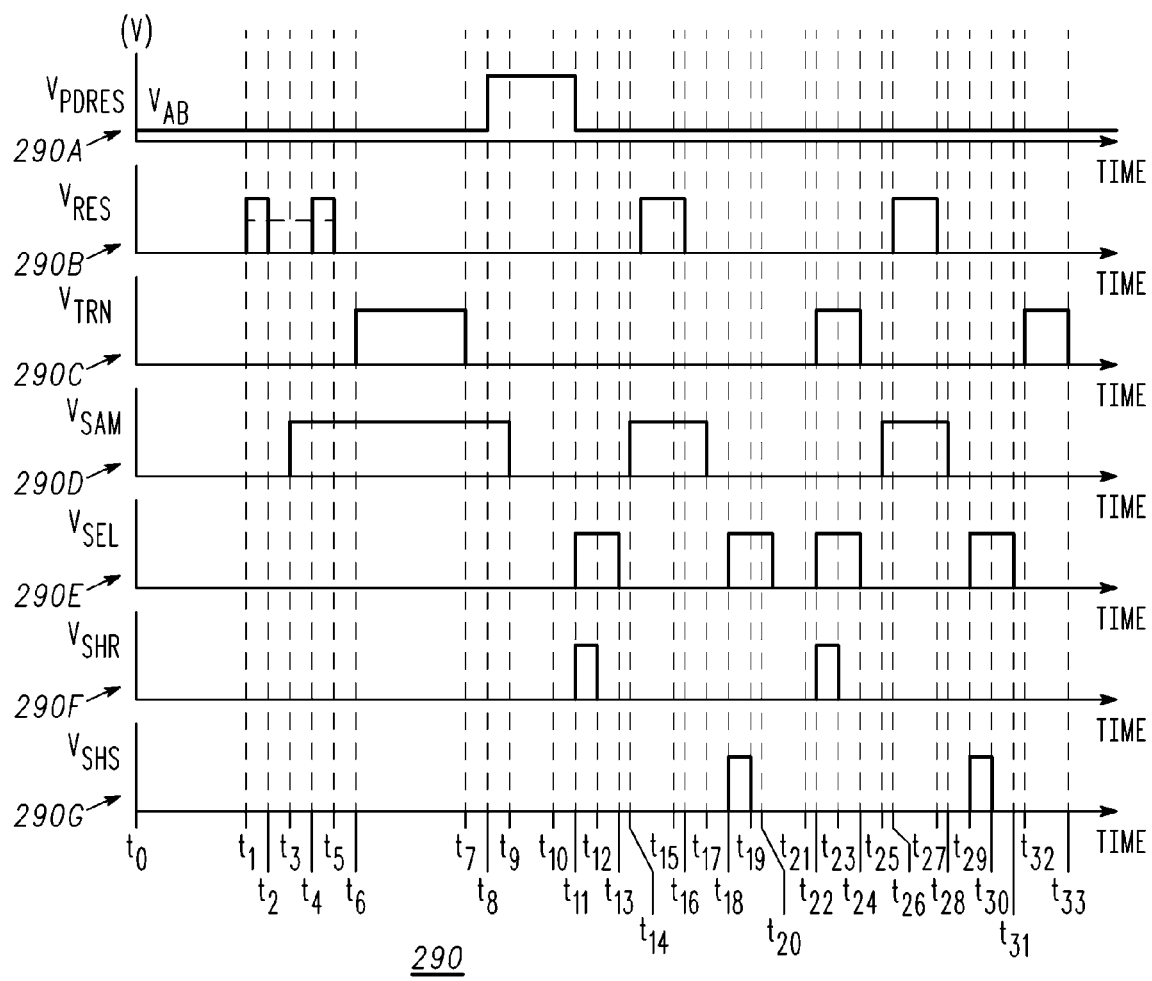
FIG. 12 is a timing diagram of a snapshot operating mode in accordance with another embodiment of the present invention.

FIG. 12 is a timing diagram 290 that includes plots 290A, 290B, 290C, 290D, 290E, and 290F illustrating the operation of, for example, pixel 200 in a snapshot operating mode in accordance with embodiments of the present invention. Plots 290A, 290B, 290C, 290D, 290E, and 290F illustrate a timing sequence for pipelined snapshot operation when a transistor such as, for example, transistor 202 of FIG. 8 is available. In accordance with this embodiment, integration of the next frame starts during readout of the previous frame, which increases the frame rate. The frame overhead time lasts from about time $t_4$ to about time $t_{10}$ and frame capturing and readout occur after about time $t_{10}$.

Figure 13:
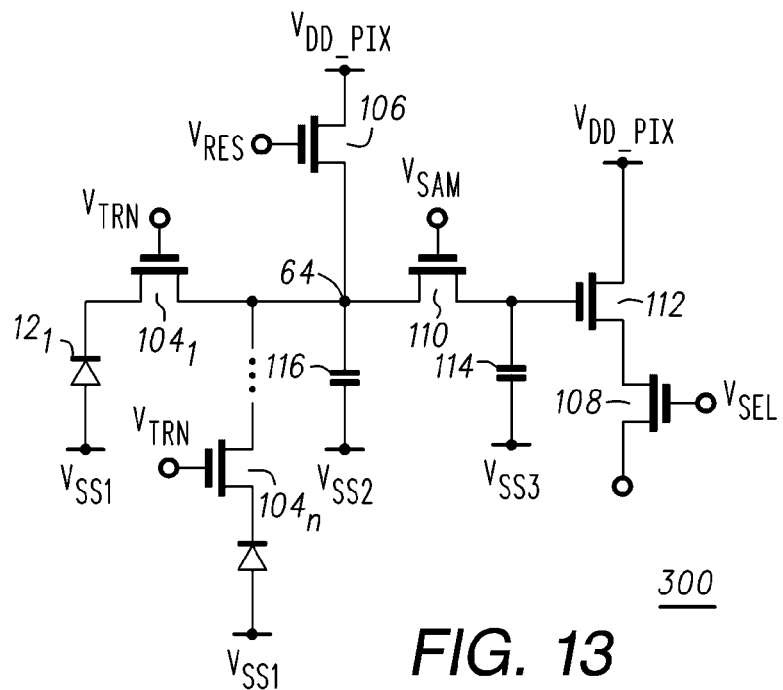
FIG. 13 is a circuit schematic of a pixel in accordance with another embodiment of the present invention.

FIG. 13 is a circuit schematic of a pixel 300 in accordance with another embodiment of the present invention. Pixel 300 is similar to pixel 100, with the addition of one or more photodiode reset transistors $104_n$ and one or more photodiodes $12_n$, wherein n is an integer greater than or equal to 2. For the sake of consistency in describing the configuration of pixel 300, a subscripted "1" has been appended to photodiode 12 and photodiode reset transistor 104 shown in FIG. 3. Thus, photodiode $12_1$ and photodiode reset transistor $104_1$ are the same as photodiode 12 and photodiode reset transistor $104_1$, respectively, described with reference to FIG. 1. Photodiode reset transistor $104_n$ has a drain connected to a cathode of photodiode $12_n$, a source connected to node 64. The anode of photodiode $12_n$ is coupled for receiving source of operating potential $V_{SS1}$. The gate of photodiode reset transistor $104_n$ is coupled for receiving a transfer voltage $V_{TRN}$.

Figure 14:
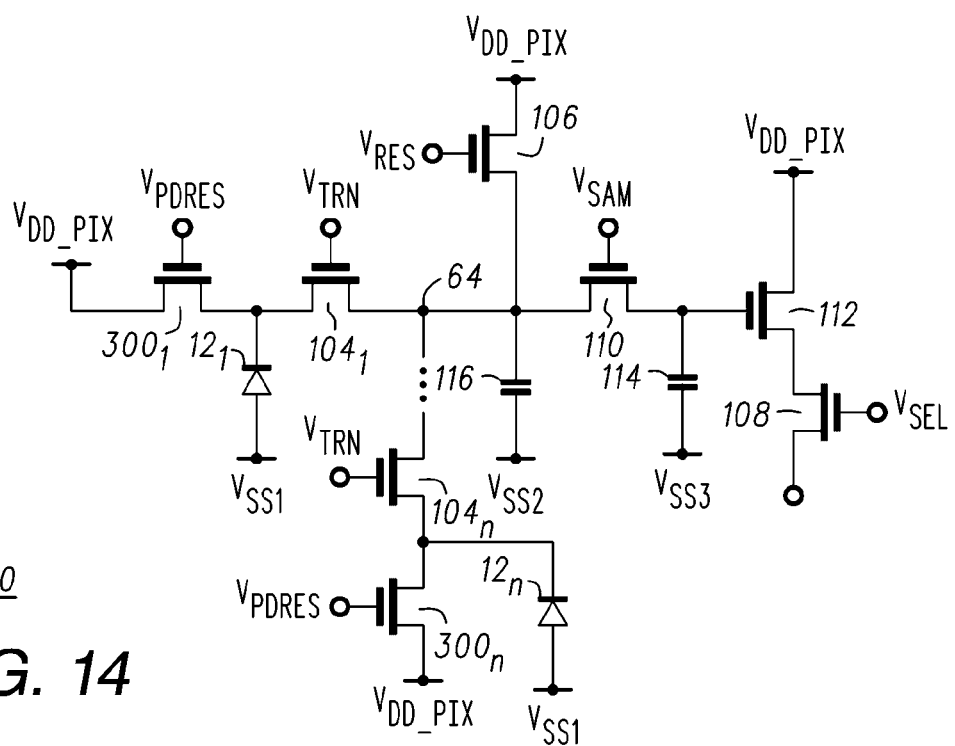
FIG. 14 is a circuit schematic of a pixel in accordance with another embodiment of the present invention.

FIG. 14 is a circuit schematic of a pixel 350 in accordance with another embodiment of the present invention. Pixel 350 is similar to pixel 200 with the addition of one or more photodiode reset transistors $300_1$, $300_n$. It should be noted that "n" is an integer greater than or equal to two. Thus, there may be one or more additional transistors $104_n$, $300_n$ and photodiodes $12_n$ connected to node 64. The source of transfer transistor $104_n$ is connected to node 64, and the drain of transfer transistor $104_n$ is connected to the source of photodiode reset transistor $300_n$ and to the cathode of photodiode $12_n$. The drain and gate of photodiode reset transistor $300_n$ are coupled for receiving source of operating potential $V_{DD\_PIX}$ and control signal $V_{PDRES}$, respectively. The gate of transfer transistor $104_n$ is coupled for receiving transfer control signal $V_{TRN}$ and the anode of photodiode $12_n$ is coupled for receiving source of operating potential $V_{SS1}$.

Figure 15:
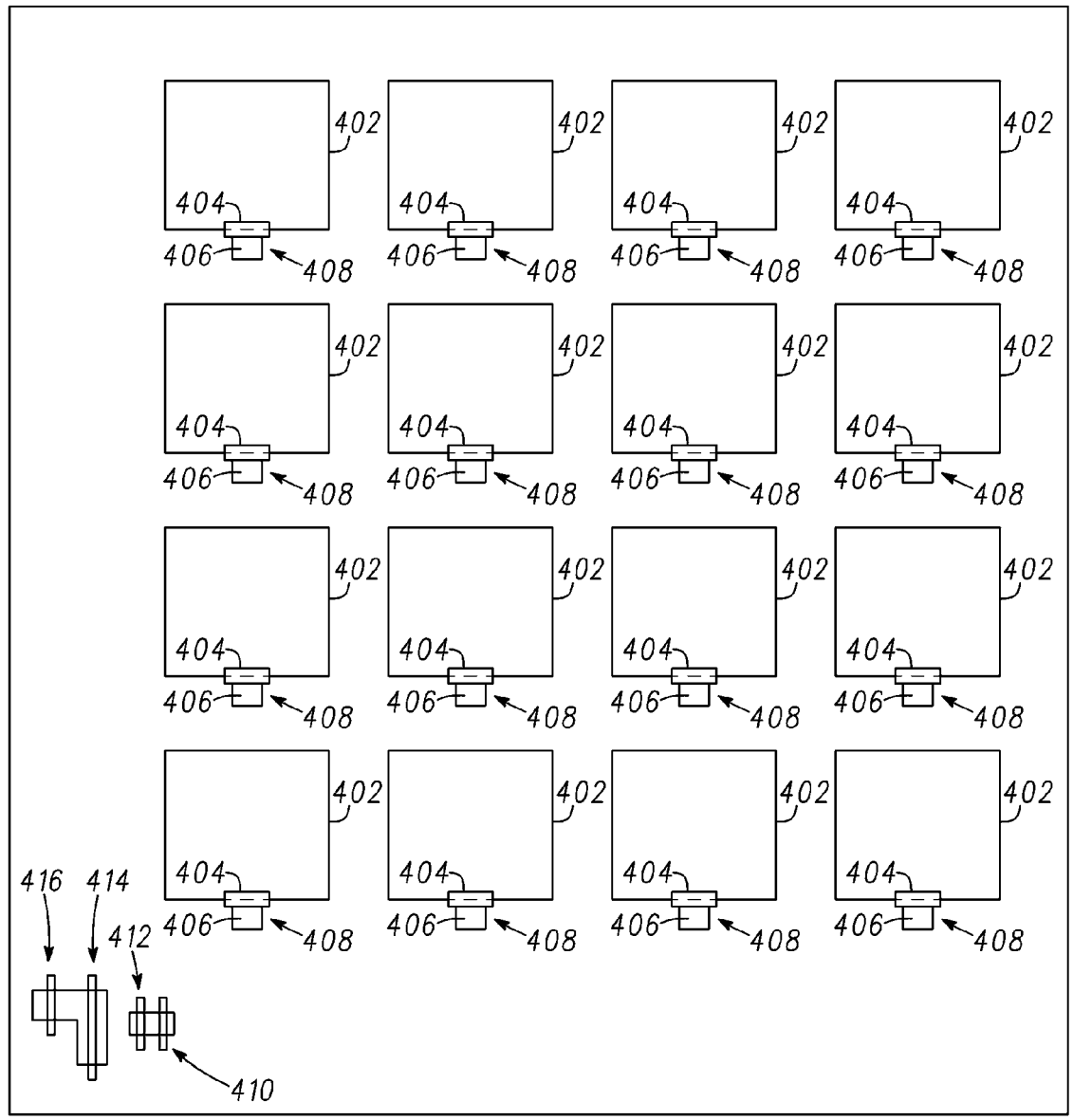
FIG. 15 is a top view of a layout of a pixel during manufacture in accordance with another embodiment of the present invention.

FIG. 15 is a top view of a layout of an image sensor comprising a plurality of pixels 400 in accordance with another embodiment of the present invention. What is shown in FIG. 14 is 4×4 array of photodiodes 402 and gate structures 404 of a transfer transistor 408. By way of example, photodiodes 402 are pinned photodiodes capable of being fully depleted at a depletion voltage $V_{PIN}$. In addition, FIG. 14 illustrates a reset transistor 410, a sampling transistor 412, a source follower transistor 414, and a select transistor 416.

Figure 16:
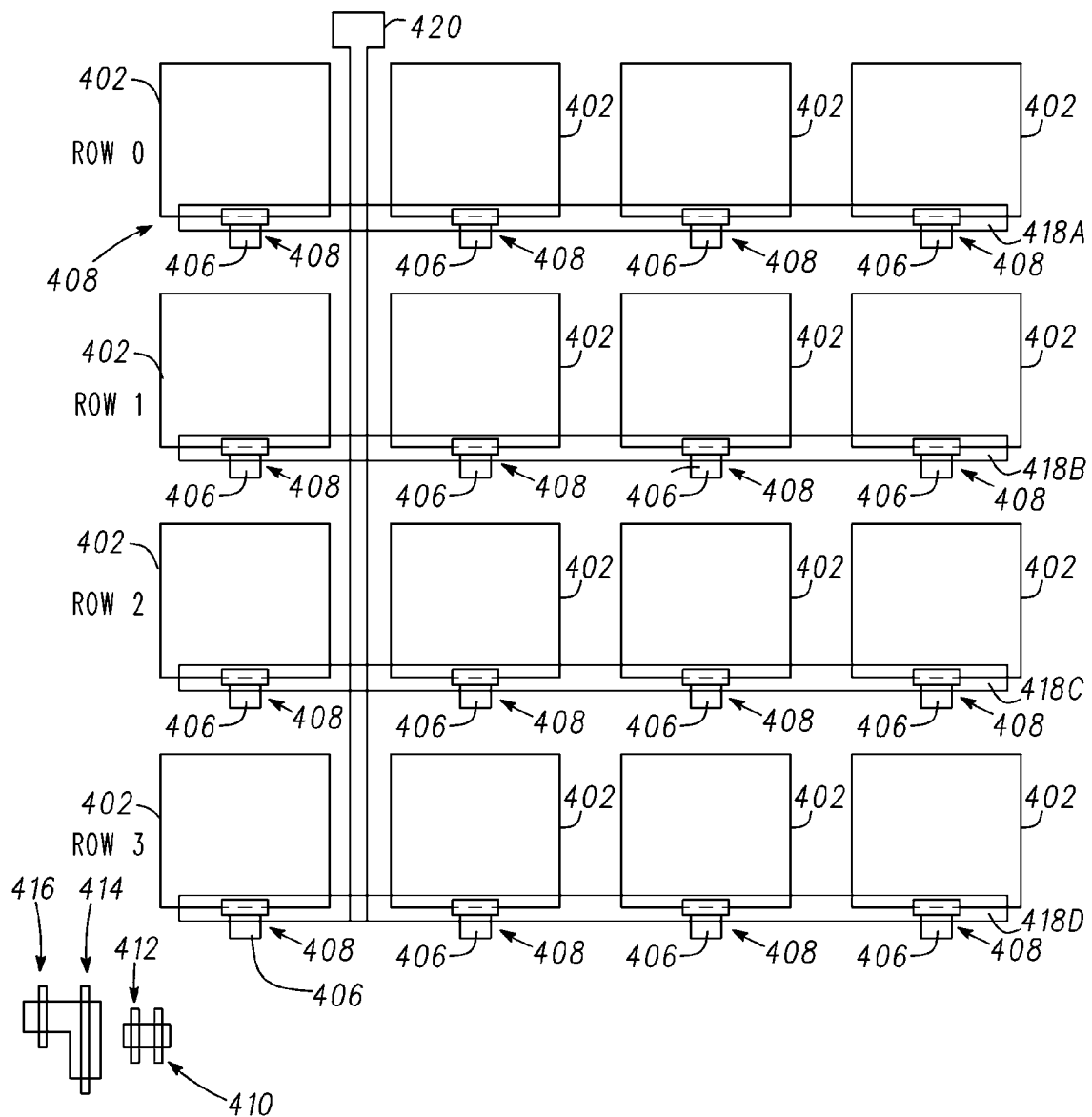
FIG. 16 is a top view of a layout of the pixel of FIG. 15 during manufacture in accordance with an embodiment of the present invention.

FIG. 16 is a top view of the layout of pixels 400 of FIG. 14 during manufacture. What is shown in FIG. 16 are gate interconnects 418A, 418B, 418C, 418D, and 420. Gate interconnect 418A electrically connects the gate structures of transfer transistors 408 associated with a first row (row 0) of pinned photodiodes together, gate interconnect 418B electrically connects the gate structures of transfer transistors 408 associated with a second row (row 1) of pinned photodiodes together, gate interconnect 418C electrically connects the gate structures of transfer transistors 408 associated with a third row (row 2) of pinned photodiodes together, and gate interconnect 418D electrically connects the gate structures of transfer transistors 408 associated with a fourth row (row 3) of pinned photodiodes together. Gate interconnect 420 electrically interconnects gate interconnects 418A-418D to each other.

Figure 17:
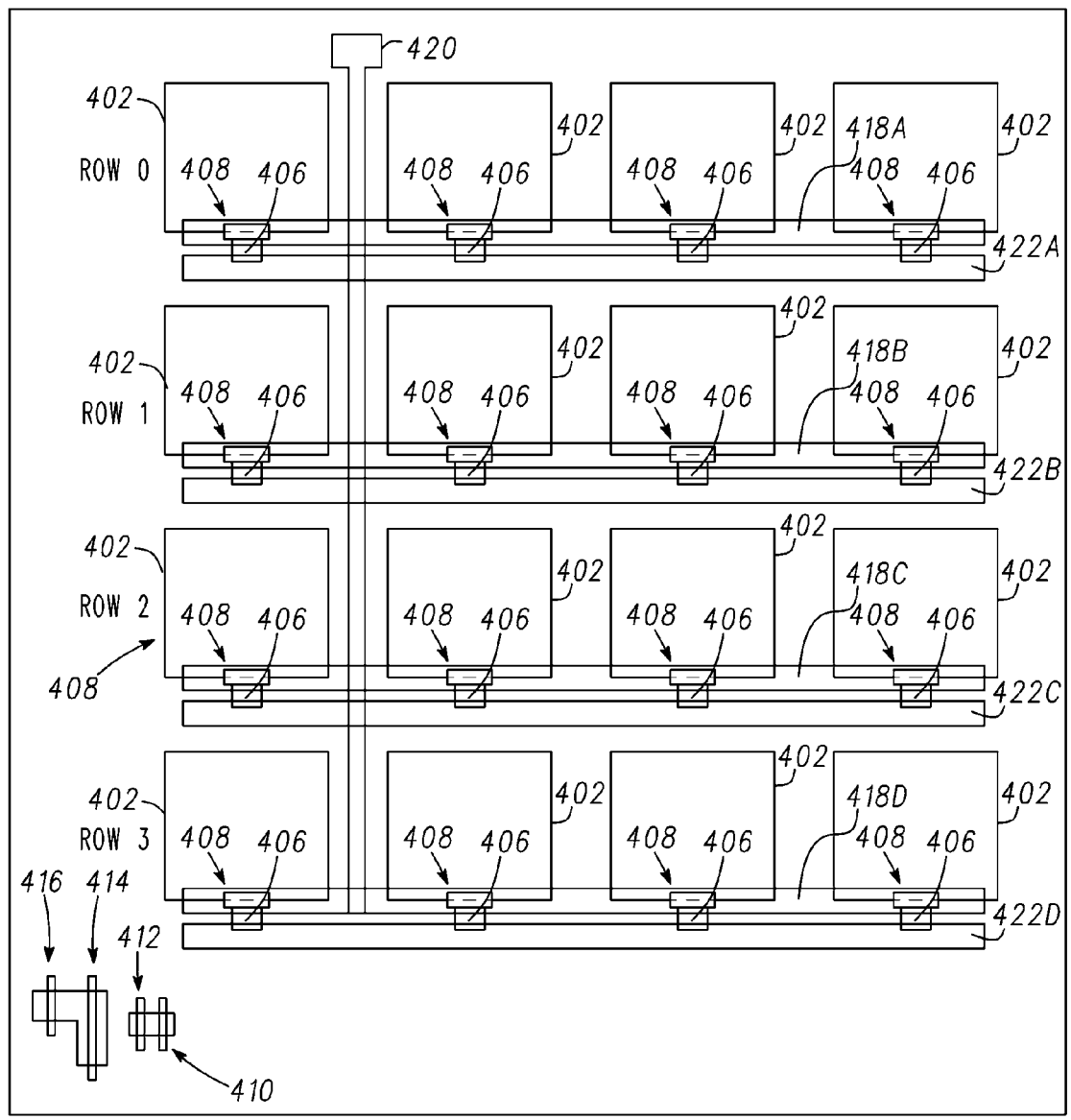
FIG. 17 is a top view of a layout of the pixel of FIG. 15 during manufacture in accordance with an embodiment of the present invention.

FIG. 17 is a top view of the layout of pixel 400 of FIG. 15 during manufacture. What is shown in FIG. 17 are drain interconnects 422A, 422B, 422C, 422D, and 424. Drain interconnect 422A electrically connects the drains of transfer transistors 408 associated with the first row (row 0) of pinned photodiodes together, drain interconnect 422B electrically connects the drains of transfer transistors 408 associated with the second row (row 1) of pinned photodiodes together, drain interconnect 422C electrically connects the drains of transfer transistors 408 associated with the third row (row 2) of pinned photodiodes together, and drain interconnect 422D electrically connects the drains of transfer transistors 408 associated with the fourth row (row 3) of pinned photodiodes together. Drain interconnect 424 electrically interconnects drain interconnects 422A-422D to each other. In addition, drain interconnect 424 electrically contacts the sources of reset transistor 410 and the drain of sampling transistor 412.

By now it should be appreciated that a new pixel topology and method have been provided. In accordance with embodiments, a 4T pixel is provided that includes a sampling transistor coupled between the transfer gate and the floating diffusion capacitor. The new pixel topology can be used to manufacture large area pixels which are comprised of a plurality of photodiodes such as, for example, fully depleted photodiodes or pinned photodiodes, and transfer gate blocks, wherein the size of the photodiodes may be maximized. Including the sampling transistor allows resetting the pinned photodiode while leaving the information stored on floating diffusion capacitor 24 undisturbed.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A pixel comprising:
   a photodiode having an anode and a cathode;
   a first switch having a control terminal and first and second current carrying terminals, the first current carrying terminal coupled to the cathode of the photodiode;
   a second switch having a control terminal and first and second current carrying terminals, the first current carrying terminal of the second switch coupled for receiving a first source of operating potential and the second current carrying terminal of the second switch coupled to the second current carrying terminal of the first switch;
   a third switch having a control terminal and first and second current carrying terminals, the first current carrying terminal of the third switch coupled to the second current carrying terminals of the first and second switches;
   an amplifier having an input coupled to the second current carrying terminal of the third switch;
   a first memory element coupled to the second current carrying terminal of the third switch; and
   a second memory element coupled to the first terminal of the third switch.

2. The pixel of claim 1, further including a fourth switch coupled to the output of the amplifier.

3. The pixel of claim 1, wherein the first memory element is a first floating diffusion capacitor.

4. The pixel of claim 1, wherein the photodiode is a pinned photodiode.

5. The pixel of claim 1, wherein the amplifier is a field effect transistor configured as a source follower.

6. A pixel, comprising:
   a 4T pixel including a first switch having a control terminal and first and second current carrying terminals and an amplifier having an input terminal and an output terminal;
   a second switch having a control terminal and first and second current carrying terminals, the first current carrying terminal of the second switch coupled to the second current carrying terminal of the first switch and the second current carrying terminal of the second switch coupled to the input terminal of the amplifier;
   a first memory element coupled to the second current carrying terminal of the second switch; and
   a second memory element coupled to the first current carrying terminal of the second switch.

7. The pixel of claim 1, wherein the second memory element is a floating diffusion capacitor.

8. The pixel of claim 7, wherein the first memory element is a floating diffusion capacitor.

9. The pixel of claim 6, wherein the second memory element is a floating diffusion capacitor.

10. The pixel of claim 6, wherein the first memory element is a floating diffusion capacitor.

11. The pixel of claim 10, wherein the second memory element is a floating diffusion capacitor.

12. The pixel of claim 6, wherein the first and second switches are first and second transistors, respectively.

13. The pixel of claim 6, further including a photodiode having first and second terminals, the first terminal coupled to the first current carrying terminal of the first switch.

14. The pixel of claim 6, wherein the 4T pixel comprises:
   a third transistor having a control electrode and first and second current carrying electrodes, the first current carrying electrode of the third transistor coupled for receiving a source of operating potential and the second current carrying electrode coupled to the second current carrying terminal of the first switch; and
   a fourth transistor having a control electrode and first and second current carrying electrodes, the first current carrying electrode coupled to the output of the amplifier.

15. The pixel of claim 14, further including a photodiode having first and second terminals, the first terminal coupled to the first current carrying terminal of the first switch.

16. The pixel of claim 15, wherein the photodiode is a pinned photodiode.

17. The pixel of claim 15, wherein the amplifier comprises a fifth transistor having a control electrode and first and second current carrying electrodes, the control electrode serving as the input terminal of the amplifier and the first current carrying electrode serving as the output terminal of the amplifier.

18. The pixel of claim 17, further including a sixth transistor having a control electrode and first and second current carrying electrodes, the first current carrying electrode commonly coupled to the first terminal of the photodiode and the first current carrying terminal of the first switch.

* * * * *